May 8, 1962 J. A. BOURGET 3,034,013

DEFLECTION CIRCUIT AND AMPLIFIER THEREFOR

Filed March 19, 1958

Inventor
Joseph Andre Bourget
Schroeder, Hofgren, Brady & Wagner
Attorneys

United States Patent Office 3,034,013
Patented May 8, 1962

3,034,013

DEFLECTION CIRCUIT AND AMPLIFIER THEREFOR

Joseph Andre Bourget, Des Plaines, Ill., assignor to Warwick Manufacturing Corporation, a corporation of Delaware Filed Mar. 19, 1958, Ser. No. 722,591
12 Claims. (Cl. 315—27)

This invention is concerned with a deflection circuit and more particularly with a transistorized deflection circuit adapted for the vertical deflection section of a television receiver and incorporating a novel amplifier circuit.

One object of the invention is to provide a push-pull transistor amplifier in which the energy delivered to the load is derived unequally from the two transistors. Another object is to provide a circuit in which this is accomplished by varying the driving signal to the transistors, or by varying the bias thereof. With the second transistor delivering more power to the load, retrace is faster and the initial current in the first transistor is kept low.

A further object is to provide a direct coupled, single-ended, push-pull transistor amplifier with an inductive load directly coupled to the outputs of the two transistors, and with a diode interposed between the output of one of the transistors and the load, to prevent transient voltage and currents developed in the inductive load from affecting the operation of the transistors. Still another object is to provide a capacitor connected in shunt with the diode, series tuning the load.

Yet a further object is to provide a tuned transistor circuit including a transistor element having a control electrode and an output electrode, a load circuit connected to the output electrode including reactive means, a signal source connected with the control electrode, and a reactive circuit interconnecting the load circuit and input electrode, effectively tuning the reactive means in the output circuit at a predetermined frequency. Still another object is to provide such a circuit in which the interconnecting circuit includes a variable impedance, to adjust the linearity of the output signal.

Another object is the provision of a transistor saw-tooth generator, including a blocking oscillator, a transistor element having a control electrode connected with the output of the blocking oscillator and having a blocking electrode, a diode interposed between the blocking oscillator and the control electrode, a load circuit connected to the output electrode and including a reactive element, and a reactive circuit interconnecting the load circuit and the input electrode, effectively tuning the reactive element in the output circuit at a predetermined frequency.

Further objects and advantages will become apparent from the following detailed description taken in connection with the accompanying drawings, in which.

Figure 1:
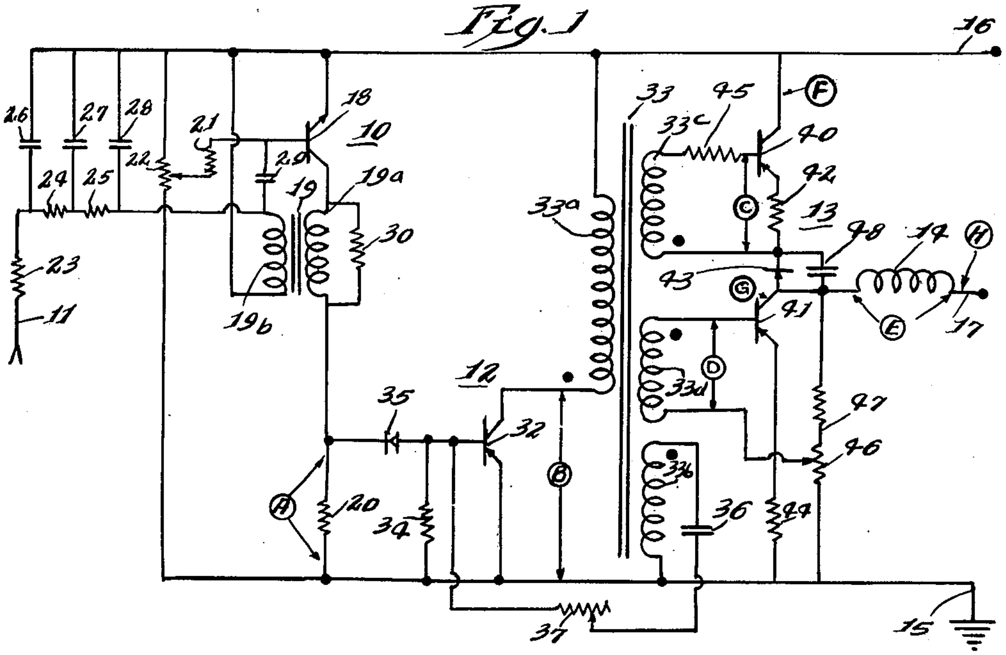
FIGURE 1 is a schematic diagram of an embodiment of the invention.

While this invention is susceptible of embodiments in many different forms, there is shown in the drawings and will herein be described in detail, an embodiment of the invention with the understanding that the present disclosure is to be considered as an exemplification of the principles of the invention and is not intended to limit the invention to the embodiment illustrated. The scope of the invention will be pointed out in the appended claims.

Transistorized television receiver circuitry is particularly adapted for battery operated sets. It is important however that such circuits have maximum possible efficiency consonant with acceptable performance standards and minimum weight, in order to conserve power and extend the useful life of the batteries. The circuit disclosed herein is particularly suited for use in the vertical deflection section of a television receiver.

Turning now to FIGURE 1 of the drawings, a circuit is shown which includes a blocking oscillator 10 triggered by a suitable synchronizing pulse applied at 11. The output of the blocking oscillator is coupled to a saw-tooth generator 12, the output of which drives a single-ended, push-pull amplifier circuit 13 having the vertical deflection yoke 14 coupled directly thereto.

The circuit will now be described in detail and values and element types assigned to the various components thereof. It is to be understood that this detailed description is intended solely to disclose an operative embodiment of the invention and that many changes will be apparent to those skilled in the art.

The circuit is energized from a D.C. source having a potential of 12 volts negative with respect to a reference or ground 15, at terminal 16 and a 6 volt negative potential at terminal 17.

Blocking oscillator 10 utilizes an NPN junction transistor, 2N213, having its emitter electrode connected to terminal 16 and its collector electrode connected through winding 19*a* of a feedback transformer 19 and load resistor 20, 220 ohms, to ground. A bias circuit for the oscillator is completed by a connection from the base electrode through resistor 21, 220,000 ohms, to the adjustable tap of a potentiometer 22, 50,000 ohms, connected between terminal 16 and ground.

Figure 2:
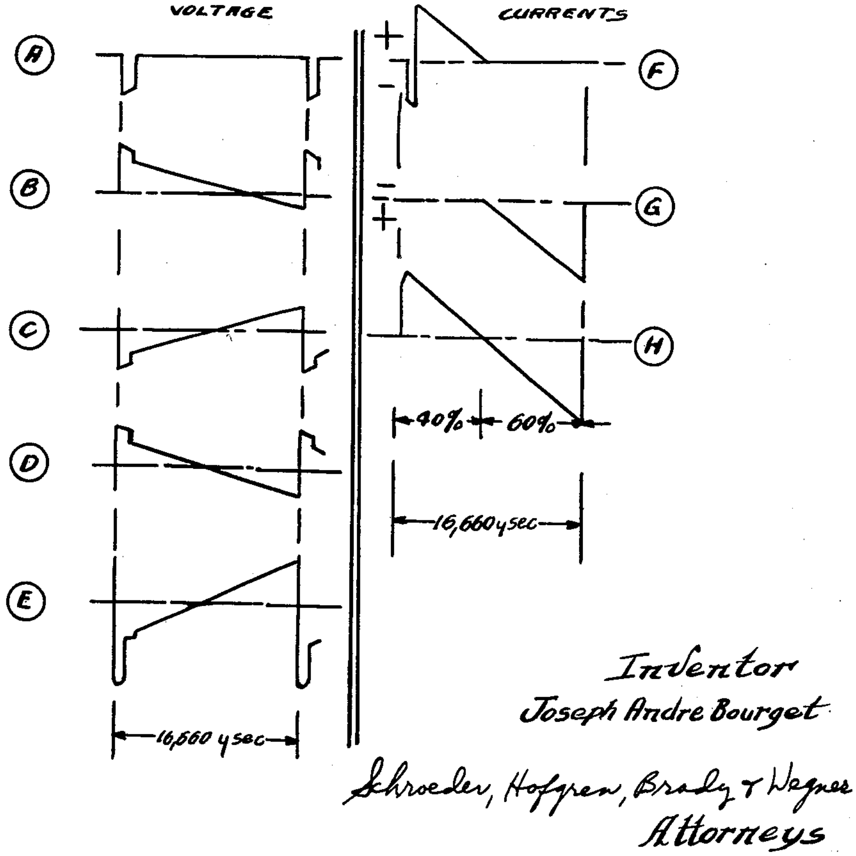
FIGURE 2 illustrates current and voltage wave forms at various indicated points in the circuit of FIGURE 1.

A positive synchronizing pulse is coupled through a resistance-capacitance shaping network including series resistors 23, 22,000 ohms, 24, 8200 ohms and 25, 8200 ohms, shunt capacitors 26, 0.002 $\mu$f. (microfarad) and 27 and 28, 0.005 $\mu$f. each, and series capacitor 29, 0.03 $\mu$f. to the base of transistor 18. Winding 19*b* of the feedback transformer has one terminal connected to negative power supply terminal 16 and the other through capacitor 29 to the base of the transistor. Loading resistor 30, 1000 ohms, shunts winding 19*a* of the feedback transformer. The output of the blocking oscillator appears across load resistor 20 and is illustrated as voltage curve A, FIGURE 2, comprising essentially a negative pulse, of the order of 700 microseconds in duration. Variable resistor 22 in the bias circuit permits minor variation of the frequency of the blocking oscillator, providing a "vertical hold" control for the system.

Saw-tooth generator 12 includes a PNP transistor 32, 2N291, connected for grounded emitter operation with a load comprising the primary winding 33*a* of output transformer 33 connected between the collector electrode and power supply terminal 16. Proper bias is achieved through a circuit including resistor 34, 1000 ohms, connected between the base electrode and ground. The negative output pulse from the blocking oscillator is applied to the base electrode of transistor 32 through a diode 35, X226, and a saw-tooth voltage wave (B, FIG. 2) is developed in the output circuit. Diode 35 prevents loading of the saw-tooth generator input circuit by the blocking oscillator circuit during trace time.

Linearity is achieved in the saw-tooth generator by a feedback circuit which derives its energy from a secondary winding 33*b* on transformer 33 and which is coupled through capacitor 36, 1.0 $\mu$f. and variable resistor 37, 500 ohms, to the base electrode of transistor 32. The transistor effectively amplifies the value of capacitor 36 so that the load, comprising essentially primary winding 33*a* of transformer 33, which has an inductance of 6 henries, appears as a tuned circuit. The necessary size of the tuning capacitor is greatly reduced by connecting it in the feedback circuit between the output circuit and the input electrode of the saw-tooth generator, as compared with the size of capacitor necessary if it were connected directly in the output circuit. Variable resistor 37 in the feedback circuit controls the amplitude of the saw-tooth wave generated and thus the height of the picture. The inverse feedback circuit reduces the effect of any non-linearity introduced in the generator itself, or in the output transformer 33, resulting in a substantially linear saw-tooth signal, with a relatively small output transformer.

The push-pull output stage comprises a pair of PNP transistors 40 and 41, each a 2N291, connected in a direct coupled, single-ended, push-pull circuit. Transistor 40 has its collector connected directly to power supply terminal 16 with its emitter connected through resisto 42, 1.5 ohms and diode 43, 1N93, to the collector of transistor 41. The emitter of transistor 41 is connected through resistor 44, 1.5 ohms, to reference potential 15, establishing a bias circuit for the emitter-collector circuits of the two transistors. The driving signals for the two transistors are obtained from the secondary windings 33*c* and 33*d* of saw-tooth generator output transformer 33. One terminal of winding 33*c* is connected through a dropping resistor 45, 220 ohms, to the base of transistor 40, while the other terminal is returned to the emitter through resistor 42. Secondary winding 33*d* has one terminal connected directly to the base of transistor 41 and the other returned to the tap of a variable resistor 46, 100 ohms, connected in series with resistor 47, 680 ohms, forming a voltage divider across a portion of the bias supply, and providing a linearity control for the push-pull amplifier, as will appear. The load, in this case the vertical deflection yoke of a television receiver, is coupled directly to the output circuits of the two transistors and to the −6 volt bias supply terminal 17.

Secondary windings 33*c* and 33*d* are phased as indicated in FIGURE 1 so that the driving signals to the two transistors are 180° out of phase. This is illustrated by voltage curves C and D, FIG. 2, taken from windings 33*c* and 33*d*, respectively. The current flowing through deflection yoke 14 is made up of two portions, the output of transistor 40 and that of transistor 41, which operate alternately. In order to achieve a rapid retrace time, it is preferable that the operation of the two transistors be unbalanced, i.e. that their duty cycle or periods of conduction be unequal, with the second of the transistors to conduct operating for a longer period of time. This provides increased retrace energy resulting in a faster retrace and in addition requires an initial current through the first transistor 40 of relatively low amplitude, as indicated by a comparison of waveforms F and G. Much the same result may be achieved, although less efficiently, by operating the two transistors from unequal power sources.

This is achieved in the present circuit by two means. First, resistor 45 in the base circuit of transistor 40 reduces the amplitude of the driving signal to this transistor; and second, the bias on the base of transistor 41 is made adjustable by means of variable resistor 46. In the circuit disclosed, transistor 40 provides current for approximately 40% of the sweep, while transistor 41 provides about 60%. The change-over between the two transistors, and thus the linearity of the deflection current is readily adjustable by manipulation of the bias potential on transistor 41.

Diode 43, interposed between the emitter of transistor 40 and the deflection yoke prevents the high inductive voltage developed in the yoke during retrace from affecting transistor 40.

Capacitor 48, 0.5 $\mu$f., is connected in shunt with diode 43 and forms a series resonant circuit with deflection yoke 14, improving the retrace time. The negative pulse at the beginning of the current wave form of the transistor 40 represents the backward current through the transistor due to the tuning condenser.

The single-ended, push-pull circuit illustrated has the advantage that the direct current flow through the deflection yoke is relatively small, of the order of 22 milliamperes in the circuit shown, and the decentering effect of this small current may readily be compensated without the use of special centering magnets.

I claim:

1. A direct coupled, single-ended, push-pull transistor amplifier, comprising: a first transistor having an input and an output; a second transistor having an input and an output; an inductive load directly conductively coupled to said outputs; a diode interposed between the output of one of said transistors and said load; means for tuning said load; a signal source connected to said inputs through circuits of differing impedance for driving said transistors alternately; and an adjustable bias circuit for one of said transistors, controlling the unbalance of the duty cycle of said transistors.

2. A direct coupled, signal-ended, push-pull transistor amplifier, comprising: a first transistor having an input and an output; a second transistor having an input and an output; an inductive load directly conductively coupled to said outputs; a diode interposed between the output of one of said transistors and said load; a signal source connected to said inputs for driving said transistors alternately, the duty cycle of said transistors being unequal; and means forming a part of said amplifier circuit for unbalancing the duty cycle of said transistors.

3. A transistor amplifier of the character described in claim 2, wherein a capacitor is connected in shunt with said diode, tuning said load.

4. In a vertical deflection system: a source of saw-tooth driving signal; a pair of transistors having inputs connected with said source of driving signal and phased to conduct alternately; a vertical deflection coil connected in push-pull relation with the outputs of said transistors; and a diode connected in the output circuit of one of said transistors with said vertical deflection coil, to prevent a clamping action in said one transistor during a portion of the retrace of the saw-tooth signal; and capacitor means connected with said circuit and forming a resonant circuit with said deflection coil during retrace of the saw-tooth signal.

5. In a vertical deflection system: a source of saw-tooth driving signal; a pair of transistors having inputs connected with said source of driving signal and phased to conduct alternately; a vertical deflection coil connected in push-pull relation with the outputs of said transistors; a diode connected in series with said deflection coil and one of said transistors, nonconductively polarized during a portion of the retrace to prevent a clamping action in said transistor during a portion of the retrace of said saw-tooth signal; and a capacitor connected with said deflection coil forming a resonant circuit during retrace.

6. In a vertical deflection system: a source of saw-tooth driving signal; a first transistor having an input connected with said source of driving signal and phased to conduct during a first portion of said saw-tooth; a second transistor connected with said source of driving signal and phased to conduct during the second portion of said saw-tooth; an output circuit for each of said transistors having a common portion including a vertical deflection coil connected in push-pull relation with said transistors; a diode connected in the output circuit of said first transistor and polarized to conduct during the first portion of said saw-tooth to prevent a clamping action in said transistor during a portion of the retrace of said saw-tooth signal; and a capacitor shunting said diode and forming a series resonant circuit with said deflection coil during retrace.

7. In a vertical deflection system: a source of saw-tooth driving signal; a first transistor having an input connected with said source of driving signal and phased to conduct during a first portion of said saw-tooth; a second transistor connected with said source of driving signal and phased to conduct during the second portion of said saw-tooth; an output circuit for each of said transistors having a common portion including a vertical deflection coil connected in push-pull relation with said transistors; a diode connected in the output circuit of said first transistor and polarized to conduct during a first portion of said saw-tooth to prevent a clamping action in said transistor during a portion of the retrace of said saw-tooth signal; a capacitor shunting said diode and forming a series resonant circuit with said deflection coil during retrace; and a resistor connected in series with the parallel combination of said diode and capacitor.

8. In a deflection system: a source of driving signal; a pair of transistors each having an input connected with said source, said transistors being alternately rendered conductive by said driving signal and each having an output circuit, said output circuits being connected together; an inductive deflection circuit connected with the output circuits of said transistors, said deflection circuit being energized by currents derived alternately from said transistors; and a diode connected between the deflection circuit and the output circuit of one of said transistors, to prevent conduction by said one transistor during the first portion of the retrace following completion of a sweep.

9. In a transistorized television deflection system: a source of driving signal for establishing a generally saw-tooth deflection current; a pair of transistors connected in a push-pull circuit each having an input control element connected with said source, said transistors being alternately rendered conductive, and said transistors having output circuits which are connected together; a deflection coil connected with the outputs of said transistors and energized by a sawtooth current, a first portion of which is derived from one transistor and a second portion from the other transistor; and a diode connected in series between the output of said one transistor and said deflection coil, said diode being conductive during the flow of deflection current from said transistor to said coil and non-conductive during the first portion of the retrace.

10. A push-pull transistor amplifier, comprising: a first transistor having an input and an output; a second transistor having an input and an output; a load circuit connected directly with said outputs; a signal source connected with said inputs for driving said transistors alternately; and a direct current power source for each of said transistors, the potential of one of said power sources being greater than that of the other for unbalancing the duty cycle of one of the transistors.

11. In a vertical deflection system: a source of saw-tooth driving signal; a pair of transistors having inputs connected with said source of driving signal and phased to conduct alternately; a vertical deflection coil connected in push-pull relation with the outputs of said transistors; and a direct current power source for each of said transistors, the potential of one of said power sources being greater than the other for unbalancing the duty cycle of said transistors.

12. In a vertical deflection system: a source of saw-tooth driving signal; a pair of transistors having inputs connected with said source of driving signal and phased to conduct alternately; a vertical deflection coil connected in push-pull relation with the outputs of said transistors; a diode connected in the output circuit of one of said transistors with said vertical deflection coil to prevent a clamping action in said transistor during a portion of the retrace of said saw-tooth signal; and a direct current power source for each of said transistors, the potential of the power source for said one transistor being greater than that for the other to unbalance the duty cycle of the transistors and decrease the clamping period of said one transistor.

References Cited in the file of this patent

UNITED STATES PATENTS

| | | |
|---|---|---|
| 2,680,160 | Yaeger | June 1, 1954 |
| 2,747,136 | Herzog | May 22, 1956 |
| 2,757,243 | Thomas | July 31, 1956 |
| 2,761,917 | Aronson | Sept. 4, 1956 |
| 2,762,870 | Sziklai | Sept. 11, 1956 |
| 2,802,071 | Lin | Aug. 6, 1957 |
| 2,812,393 | Patrick | Nov. 5, 1957 |
| 2,814,736 | Hamilton | Nov. 26, 1957 |
| 2,821,657 | Newhouse | Jan. 28, 1958 |
| 2,844,739 | Avins | July 22, 1958 |
| 2,847,519 | Aronson | Aug. 12, 1958 |
| 2,849,626 | Klapp | Aug. 26, 1958 |
| 2,860,195 | Stanley | Nov. 11, 1958 |
| 2,860,196 | Schultz | Nov. 11, 1958 |
| 2,888,622 | Mooers | May 26, 1959 |
| 2,896,115 | Guggi | July 21, 1959 |
| 2,911,566 | Taylor | Nov. 3, 1959 |
| 2,913,625 | Finkelstein | Nov. 17, 1959 |